(12) United States Patent
Nakajima

(10) Patent No.: US 6,642,634 B2
(45) Date of Patent: Nov. 4, 2003

(54) VERTICAL RAMP WAVE GENERATING CIRCUIT

(75) Inventor: Kenichi Nakajima, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 108 days.

(21) Appl. No.: 10/029,893

(22) Filed: Dec. 21, 2001

(65) Prior Publication Data

US 2002/0104667 A1 Aug. 8, 2002

(30) Foreign Application Priority Data

Dec. 25, 2000 (JP) ........................................ 2000-392150

(51) Int. Cl.$^7$ ................................................ H03K 5/08
(52) U.S. Cl. .................... 307/228; 307/254; 315/397
(58) Field of Search ................. 327/132, 127, 327/482; 315/397, 403, 408

(56) References Cited

U.S. PATENT DOCUMENTS

| | | | | |
|---|---|---|---|---|
| 4,339,669 A | * | 7/1982 | Jarrett et al. ................. | 327/132 |
| 4,728,813 A | * | 3/1988 | Diller ........................... | 327/132 |
| 4,730,148 A | * | 3/1988 | Nakata ......................... | 315/397 |
| 4,942,341 A | * | 7/1990 | Imaizumi ..................... | 315/403 |
| 6,288,748 B1 | * | 9/2001 | Watanabe et al. ............ | 348/511 |
| 6,522,363 B1 | * | 2/2003 | Deiss et al. .................. | 348/459 |
| 6,529,245 B2 | * | 3/2003 | Watanabe et al. ............ | 348/556 |

* cited by examiner

*Primary Examiner*—Bao Q. Vu
(74) *Attorney, Agent, or Firm*—Fish & Richardson P.C.

(57) ABSTRACT

The invention includes: a capacitor 11 for generating ramp wave; a constant current source 10 for supplying constant current to the capacitor 11 for generating ramp wave; voltage fixing means for charging the capacitor 11 for generating ramp wave and for fixing a terminal of the capacitor 11 by force to a designated reference voltage Vref; and a counter circuit 15 enabling to output control signal having pulse width corresponding to desired waiting time, and that terminal voltage 17 of capacitor 11 for generating ramp wave is fixed to reference voltage while waiting time set by the counting circuit 15.

5 Claims, 4 Drawing Sheets

DISTURBANCE NOISE OF fh COMPONENT

VERTICAL RAMP WAVE GENERATING CIRCUIT

BACKGROUND OF THE INVENTION

1. Field of the Invention

The present invention relates to a ramp wave generating circuit for vertical scanning in a television receiver and various kinds of monitoring instruments (referred to as television receiver and the like hereafter), particularly to a vertical ramp wave generating circuit improving interlace characteristics.

2. Description of the Related Art

A vertical ramp wave generating circuit according to the conventional example is shown in FIG. 5. A constant current source 1 supplies constant current I1 to a capacitor 3, and a constant current source 2 lets charge current I2 flow to a ground GND from the capacitor 3 when a switch SW1 closes. Fundamentally, by opening and closing the switch SW1, ramp wave voltage generates at a terminal 9 of the capacitor. Here, a circuit construction for opening and closing the switch SW1 is the followings.

Terminal voltage of the capacitor 3 is supplied to an inversion-input terminal (−) of a differential amplifier 4 for level-detecting, and to non-inversion input terminal (+) thereof, designated reference voltage Vref is supplied. Symbol 7 is a RS flip-flop supplying control signal for opening and closing the switch SW1. To a reset terminal R thereof, a designated reset pulse signal is supplied as a trigger signal, and on the other hand, to a set terminal S, level detecting output of the above-mentioned differential amplifier 4 is supplied.

Operation of the vertical ramp wave generating circuit having the above-mentioned construction will be described referring to FIG. 5 and operation timing chart shown in FIG. 6. When reset pulse signal ("H" level for example) generates, the pulse signal is held by the RS flip-flop 7 so that the switch SW1 closes responding on output Q ("H" level) of the RS flip-flop 7. Thus, discharge current I2 flows.

Then, output of the differential amplifier 4 is inverted when voltage of the terminal 9 decreases to reference voltage Vref. As the result, the RS flip-flop 7 is set, output Q of the RS flip-flop 7 is made "L", and the switch SW1 opens and discharge current I2 is cut off responding on this. Thus, the capacitor 3 is charged by the constant current source 1. Because of that, voltage of the terminal 9 rises so that ramp wave starts to generate.

However, disturbance of horizontal frequency fh component generates in television receiver and the like. Here, one image picture consists of two fields, an even field and an odd field in the television receiver and the like interlacing. As the disturbance of fh component generates shifting ½ vertical period in theses fields, interlace characteristics happens to get worse when the disturbance of fh component including in any of fields occurs at starting timing of ramp wave generating.

That is, when disturbance of fh component shown in FIG. 7 generates, level of reference voltage Vref changes. Then, because the differential amplifier 4 carrying out level-detecting outputs invertedly at point A (point where reference voltage Vref ramp wave shifted by disturbance of fh component crosses, shifted voltage ΔV generates. When the shifted voltage ΔV exceeds allowance, interlace characteristics gets worse.

SUMMARY OF THE INVENTION

Then, an object of the invention is to provide a vertical ramp wave generating circuit improving interlace characteristics. Further another object is to provide a vertical ramp wave generating circuit suitable for IC.

The vertical ramp wave generating circuit for generating ramp wave for vertical deflection according to the invention is characterized in providing a capacitor for generating ramp wave, a constant current source for supplying constant current to said capacitor for generating ramp wave, voltage fixing means for discharging said capacitor for generating ramp wave and for fixing a terminal of the capacitor by force to the designated reference voltage, and a counting circuit enabling to output control signal having pulse width corresponding to desired waiting time, and by that terminal voltage of said capacitor for generating ramp wave is fixed to said reference voltage while waiting time set by said counting circuit, by operating said voltage fixing means corresponding to control signal output by said counting circuit.

According to the means, as the terminal voltage of the capacitor for generating ramp wave is fixed to reference voltage, even if disturbance of fh component generates at starting point of ramp, the terminal voltage of the capacitor for generating ramp wave is fixed again to reference voltage after the disturbance is distinguished while desired waiting time. As the above-described waiting time is set by the counting circuit, it is possible to determine accurately starting timing of ramp and to improve interlace characteristics surely.

DESCRIPTION OF THE PREFERRED EMBODIMENTS

Figure 1:
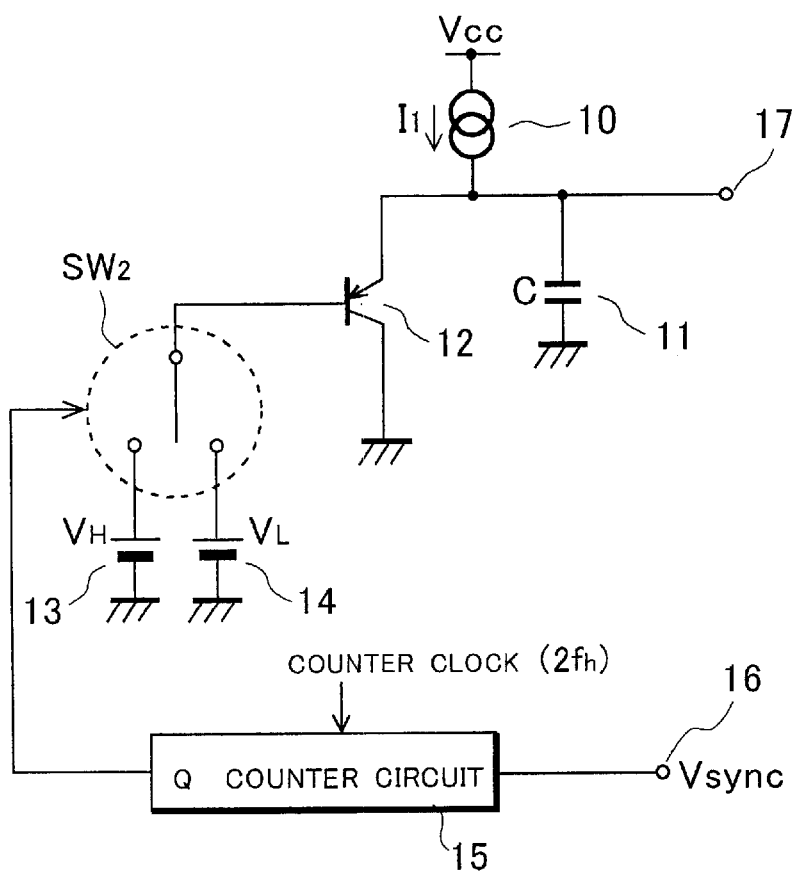
FIG. 1 is a circuit diagram of a vertical ramp wave generating circuit according to a mode for carrying out the invention.
Figure 2:
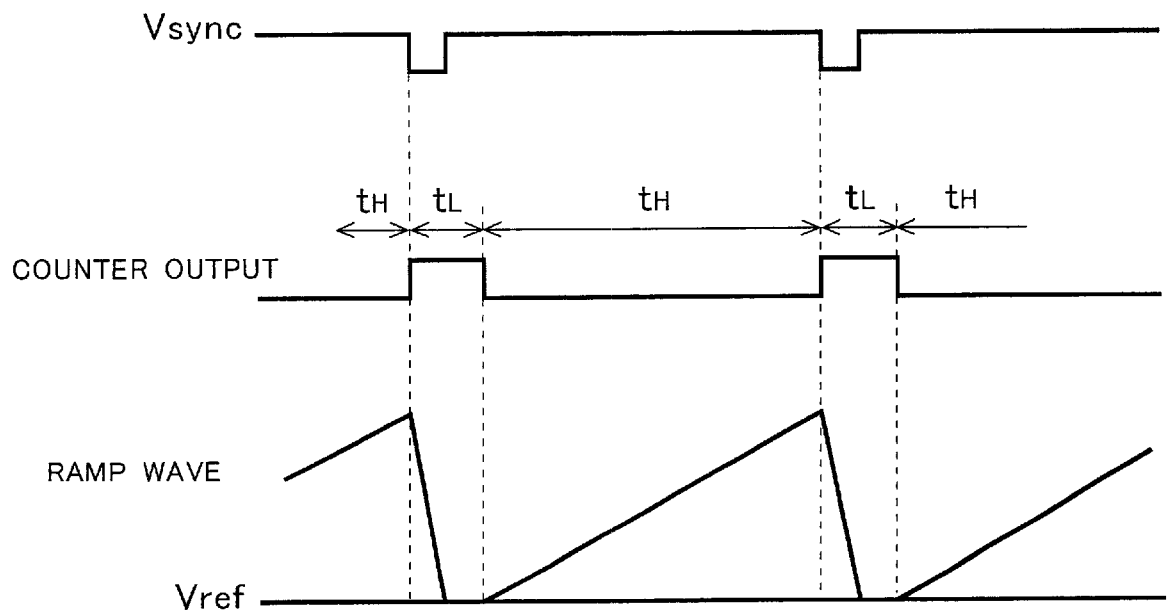
FIG. 2 is an operation-timing chart of the vertical ramp wave generating circuit according to the mode for carrying out the invention.
Figure 3:
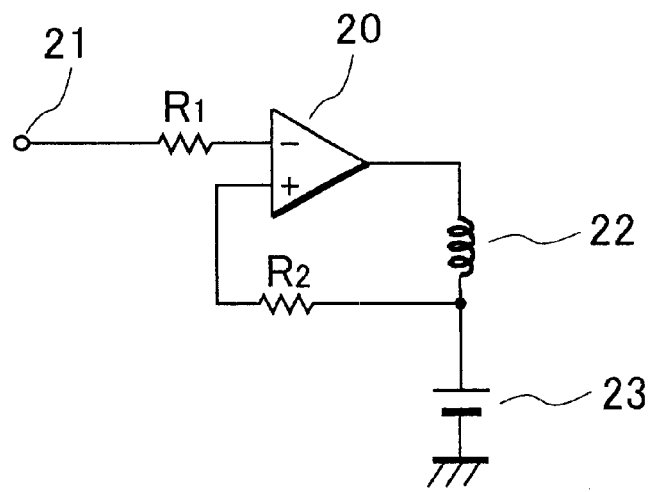
FIG. 3 is a circuit diagram showing a vertical deflecting driving circuit to which output of the vertical ramp wave generating circuit is supplied according to the conventional example.

Next, a mode for carrying out the invention will be described referring figures. A vertical ramp wave generating circuit according to the invention is shown in FIG. 1. An operation-timing chart of the vertical ramp wave generating circuit shown in FIG. 1 is shown in FIG. 2. A vertical deflection driving circuit supplied with output of the vertical ramp wave generating circuit according to the mode for carrying out the invention is shown in FIG. 3.

In FIG. 1, symbol 10 is a constant current source for supplying constant current I1 to a capacitor 11 for generating ramp wave. Symbol 12 is a PNP transistor for fixing voltage, emitter thereof is connected to a terminal 17 of the capacitor 11, and collector thereof is connected to ground GND. An output terminal OUT of ramp wave is taken out from the terminal 17 of the capacitor 11.

Symbol 13 is a voltage source supplying high voltage VH, and symbol 14 is a voltage source supplying low voltage VL. To base of above-mentioned PNP transistor 12, these voltages VH and VL are supplied in alternative way being switched by a switch SW2.

Here, when high voltage VH is supplied to the base of the PNP transistor 12, the transistor 12 is made off. On the other hand, when low voltage VL is supplied, the transistor 12 is made on, and level of the terminal 17 (emitter of the transistor 12) of the capacitor 11 falls rapidly by flow of emitter current so as to be fixed to reference voltage Vref (Vref=VL+VBE). Here, VBE is voltage between base and emitter of the PNP transistor 12.

Symbol 15 is a counter circuit (counting circuit), which starts counting corresponding to the designated trigger pulse signal supplied to a trigger terminal 16, and outputs control signal Q (high level signal) having the desired pulse width (time). Construction of the counter circuit 15 is well known, and generally standard count clock may be input to the clock-input terminal of the first stage of flip-flop connecting stages of flip-flops.

For said trigger pulse signal, vertical synchronous signal Vsync can be used. Reset pulse by self-reset from the counter circuit 15 can be used for signal suitable to the vertical synchronous signal Vsync.

It is suitable to use frequency clock of 2fh (fh is horizontal frequency) for standard clock of the counter circuit 15.

The counter circuit 15 is constructed so as to be able to self-reset corresponding to trigger pulse signal. Pulse width tL of control signal output from the counter circuit 15 can be set to the desired value by numbers of stage n of flip-flops. The pulse width tL corresponds to waiting time till start of ramp wave generating, and the waiting time tL is 2nfh clocks.

When output Q of the counter circuit 15 is high (H) level, the switch SW2 is switched so that the voltage source 14 of low voltage VL side is connected to base of the PNP transistor 12. When output Q of the counter circuit 15 is low (L) level, the switch SW2 is switched so that the voltage source 13 of high voltage VH side is connected to base of the PNP transistor 12.

Next, fundamental operation of the vertical ramp wave generating circuit having the above-mentioned structure will be described referring FIG. 3. The counter circuit 15 outputs "H" level during waiting time tL responding on vertical synchronous signal Vsync.

Then, as the switch SW2 changes to voltage source 14 side, low voltage VL is supplied to base of the transistor 12, the transistor 12 is made on, level of the terminal 17 (emitter of the transistor 12) of capacitor 11 falls rapidly by flow of emitter current so as to be fixed to reference voltage Vref. When waiting time tL finishes, high voltage VH is supplied to base of the transistor 12 as the switch SW2 switches to voltage source 13 side, the transistor 12 is made off, and the capacitor 11 for ramp wave generating is charged by the constant current source 10 so that generation of ramp wave starts.

Output OUT of the vertical ramp wave generating circuit is supplied to the vertical deflection driving circuit shown in FIG. 3 for example. Output ramp wave is supplied to an inversion-input terminal (−) of the differential amplifier 20 through an input terminal 21 and an input resistance R1.

Output of the differential amplifier 20 is supplied to one end of a vertical deflection yoke coil 22. The other end of the vertical deflection yoke coil 22 is connected to a ground GND through a capacitor 23. Voltage of the connecting point of the vertical deflection yoke coil 22 and the capacitor 23 is fed back to non-inversion input terminal (+) of the differential amplifier 20 through a resistor R2. Thus, output ramp wave of the vertical ramp wave generating circuit is amplified by the vertical deflection driving circuit so as to be supplied to the vertical deflection yoke coil 22.

Figure 4:
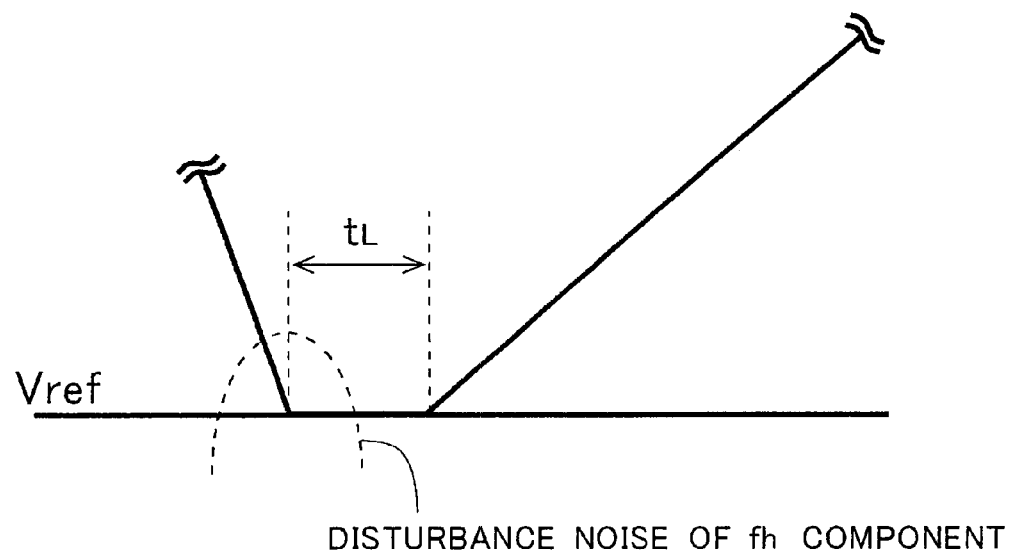
FIG. 4 is an operation waveform diagram of the vertical ramp wave generating circuit according to the mode for carrying out the invention.
Figure 5:
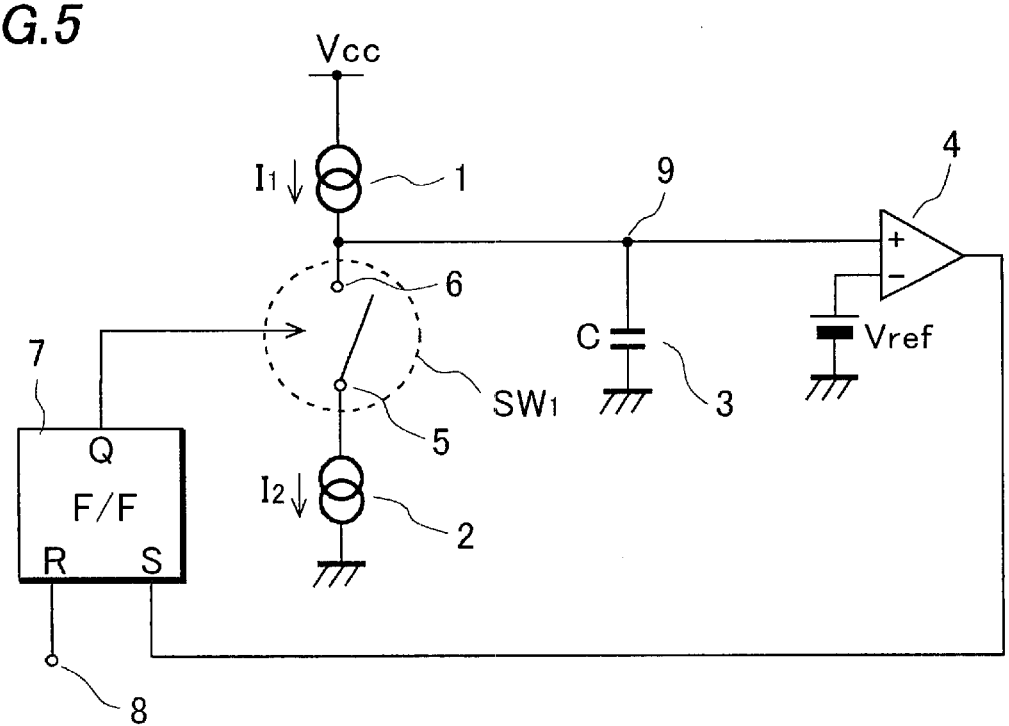
FIG. 5 is a circuit diagram of a vertical ramp wave generating circuit according to the conventional example.
Figure 6:
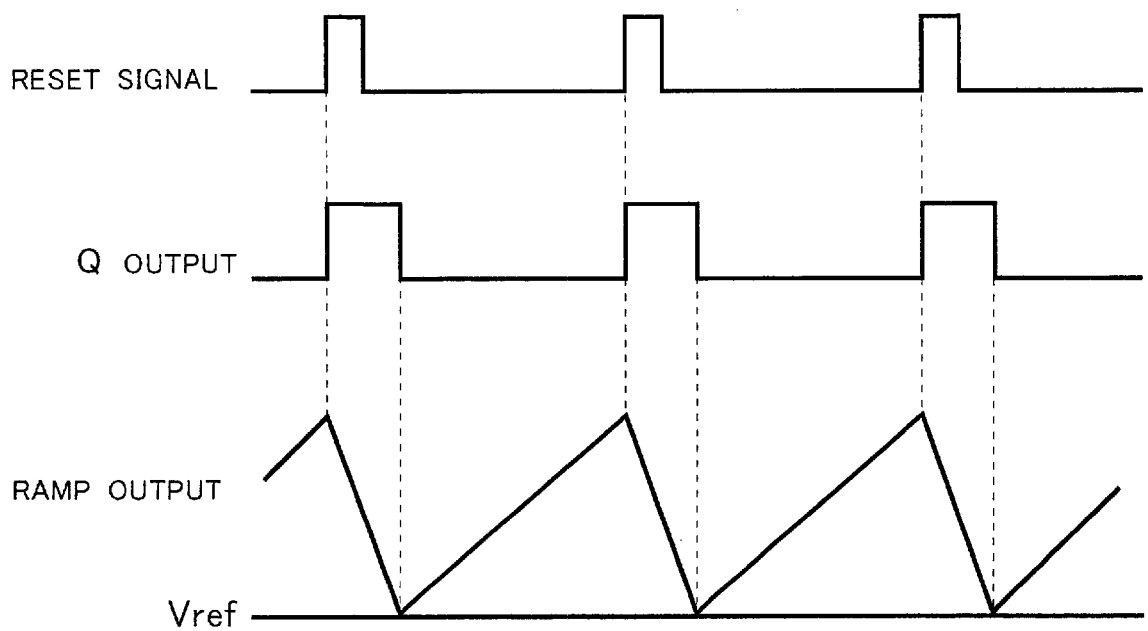
FIG. 6 is an operation-timing chart of the vertical ramp wave generating circuit according to the conventional example.
Figure 7:
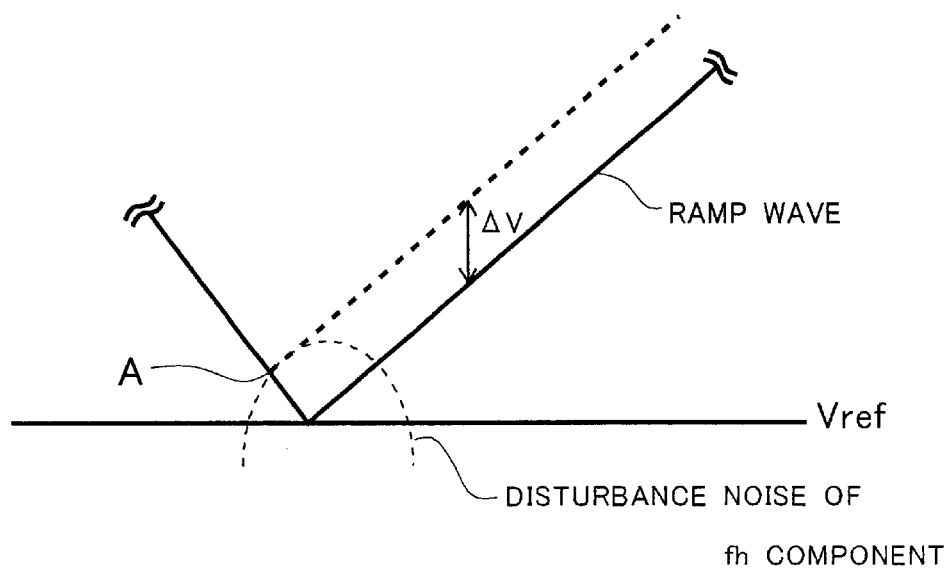
FIG. 7 is an operation waveform diagram of the vertical ramp wave generating circuit according to the conventional example.

Next, operation of the case that disturbance is applied at ramp start of the vertical ramp wave generating circuit having the above-mentioned construction will be described referring FIG. 4. When disturbance of horizontal frequency fh component shown in the figure is applied, the terminal 17 of the capacitor 11 for generating ramp wave is influenced while the disturbance is applied. However, the terminal 17 of the capacitor 11 for generating ramp wave is always drawn by reference voltage Vref during said waiting time tL and returns to the original reference voltage Vref after the above-mentioned disturbance is distinguished.

Therefore, ramp starting time becomes constant as being determined by waiting time tL. Even if timing of disturbance generation of horizontal frequency fh component is dragged after finishing waiting time tL, it is prevented that interlace characteristics gets worse as ramp starting time is determined by waiting time tL.

Thus, since a method of fixing level during waiting time tL set by the counter circuit 15 is adopted instead of adopting the construction feeding the level detecting signal back carrying out the conventional level detecting in the vertical ramp wave generating circuit according to the invention, it is possible to always make ramp starting time constant even if disturbance of fh component is applied.

According to the invention, as waiting time tL is set by the counter circuit 15, it is easy to make IC and waiting time tL is set accurately comparing with the method that waiting time is set by a delay circuit using exterior mono-stable multi-vibrator and the like and interlace characteristics is improved.

According to the vertical ramp wave generating circuit of the invention, starting timing of ramp can be determined accurately so it is possible to improve interlace characteristics surely even if disturbance of fh component is applied at starting point of ramp because terminal voltage of the capacitor for generating ramp wave is fixed to reference voltage while waiting time set by the counting circuit.

What is claimed is:

1. A vertical ramp wave generating circuit for generating ramp wave for vertical deflection characterized by that the vertical ramp wave generating circuit includes: a capacitor for generating ramp wave; a constant current source for supplying constant current to said capacitor for generating ramp wave; voltage fixing means for discharging said capacitor for generating ramp wave and for fixing a terminal of the capacitor by force to designated reference voltage; and a counting circuit enabling to output control signal having pulse width corresponding to desired waiting time, and that terminal voltage of said capacitor for generating ramp wave is fixed to said reference voltage while waiting time set by said counting circuit, by operating said voltage fixing means corresponding to control signal output by said counting circuit.

2. A vertical ramp wave generating circuit according to claim 1, characterized by that said voltage fixing means includes: a transistor, emitter of which is connected to a terminal of said capacitor for generating ramp wave; and a switch for supplying either of first voltage VL and second voltage VH which is higher than VL, by switching, to base of the transistor responding to control signal output by said counting circuit, and that said terminal of the capacitor for generating ramp wave is fixed to said designated reference voltage while the first voltage VL is supplied to base of said transistor and said transistor is made off while the second voltage VH of base of the transistor is supplied.

3. A vertical ramp wave generating circuit according to claim 2, characterized in further providing a first voltage source supplying said first voltage VL and a second voltage source supplying said second voltage VH.

4. A vertical ramp wave generating circuit according to claim 1, characterized by that said counting circuit starts counting operation responding on vertical synchronous signal.

5. A vertical ramp wave generating circuit according to claim 1, characterized by that counting clock of said counting circuit is clock having double frequency of horizontal frequency.

* * * * *